(12) United States Patent
Ryu et al.

(10) Patent No.: US 11,873,574 B2
(45) Date of Patent: Jan. 16, 2024

(54) SYSTEMS AND METHODS FOR PRODUCTION OF SILICON USING A HORIZONTAL MAGNETIC FIELD

(71) Applicant: GlobalWafers Co., Ltd., Hsinchu (TW)

(72) Inventors: JaeWoo Ryu, Chesterfield, MO (US); JunHwan Ji, Cheonan-Si (KR); WooJin Yoon, Cheonan-Si (KR); Richard J. Phillips, St. Peters, MO (US); Carissima Marie Hudson, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 14 days.

(21) Appl. No.: 17/115,154

(22) Filed: Dec. 8, 2020

(65) Prior Publication Data

US 2021/0180206 A1 Jun. 17, 2021

Related U.S. Application Data

(60) Provisional application No. 62/947,785, filed on Dec. 13, 2019.

(51) Int. Cl.
| | |
|---|---|
| *C30B 15/10* | (2006.01) |
| *C30B 15/20* | (2006.01) |
| *C30B 15/30* | (2006.01) |
| *C30B 29/06* | (2006.01) |
| *C30B 30/04* | (2006.01) |

(52) U.S. Cl.
CPC .............. *C30B 15/10* (2013.01); *C30B 15/20* (2013.01); *C30B 15/30* (2013.01); *C30B 29/06* (2013.01); *C30B 30/04* (2013.01)

(58) Field of Classification Search
CPC ......... C30B 15/10; C30B 15/20; C30B 15/30; C30B 15/305; C30B 29/06; C30B 30/04
See application file for complete search history.

(56) References Cited

U.S. PATENT DOCUMENTS

| | | |
|---|---|---|
| 5,096,857 A | 3/1992 | Hu et al. |
| 2003/0106491 A1 | 6/2003 | Kemmochi et al. |
| 2010/0031870 A1 | 2/2010 | Hariprasad et al. |

(Continued)

FOREIGN PATENT DOCUMENTS

| | | |
|---|---|---|
| EP | 0482534 A2 | 4/1992 |
| EP | 1801268 A1 | 6/2007 |

(Continued)

OTHER PUBLICATIONS

International Search Report and Written Opinion issued by the International Search Authority regarding PCT/US2020/064231 dated Feb. 4, 2021; pp. 1-12.

(Continued)

*Primary Examiner* — Hua Qi
(74) *Attorney, Agent, or Firm* — Armstrong Teasdale LLP

(57) ABSTRACT

A method for producing a silicon ingot by the horizontal magnetic field Czochralski method includes rotating a crucible containing a silicon melt, applying a horizontal magnetic field to the crucible, contacting the silicon melt with a seed crystal, and withdrawing the seed crystal from the silicon melt while rotating the crucible to form a silicon ingot. The crucible has a wettable surface with a cristobalite layer formed thereon.

10 Claims, 6 Drawing Sheets
(2 of 6 Drawing Sheet(s) Filed in Color)

(56) References Cited

U.S. PATENT DOCUMENTS

| | | | |
|---|---|---|---|
| 2010/0162947 A1* | 7/2010 | Harada | C30B 15/10 |
| | | | 117/206 |
| 2011/0195251 A1* | 8/2011 | Gmeilbauer | C30B 29/06 |
| | | | 428/401 |
| 2012/0043644 A1 | 2/2012 | Ono et al. | |
| 2012/0056135 A1 | 3/2012 | DeLuca et al. | |
| 2014/0174339 A1* | 6/2014 | Kimura | C30B 29/06 |
| | | | 117/32 |
| 2019/0145019 A1* | 5/2019 | Kishi | C03C 3/06 |
| | | | 117/208 |
| 2019/0249331 A1* | 8/2019 | Narushima | C30B 29/06 |

FOREIGN PATENT DOCUMENTS

| | | | |
|---|---|---|---|
| EP | 1087040 B1 | | 1/2009 |
| JP | 2010030867 A | * | 2/2010 |
| JP | 2010030867 A | | 2/2010 |
| JP | 2018138508 A | * | 9/2018 |
| JP | 2018138508 A | | 9/2018 |

OTHER PUBLICATIONS

Niibori, Dissolution Rates of Amorphous Silicia in Highly Alkaline Solution, Journal of Nuclear Science and Technology, Feb. 18, 1999, p. 349-357, vol. 37, No. 4.

* cited by examiner

SYSTEMS AND METHODS FOR PRODUCTION OF SILICON USING A HORIZONTAL MAGNETIC FIELD

CROSS-REFERENCE TO RELATED APPLICATIONS

This application claim priority to U.S. Provisional Patent Application No. 62/947,785 filed Dec. 13, 2019, the entire disclosure of which is hereby incorporated by reference in its entirety.

FIELD

This disclosure generally relates to the production of silicon ingots, and more specifically, to methods and systems for achieving a high success ratio producing silicon ingots in the Czochralski process using a horizontal magnetic field.

BACKGROUND

During the 1990's, at least some high quality silicon growth was mainly controlled by the thermal condition of the puller and more specifically the hot zone (HZ) design itself, because the ratio of the pulling speed to the thermal gradient (v/G) was considered the dominant factor. In the late 1990's, further consideration of the crystal/melt interface at the same v/G was included in the growth of at least some high quality silicon. At that time, application of high quality silicon to memory devices really expanded as more customers transitioned from epi to polished and from 200 mm to 300 mm silicon. Soon after, it became established that high quality silicon growth requires very stable process growth conditions and controlled melt flow to achieve the specific crystal/melt needed to achieve the desired low crystal defectivity during growth.

Peripherally, as silicon crystal growth transitioned from 200 mm to 300 mm and corresponding charge sizes increased to maintain productivity, the need for magnetic field application to stabilize melt flow in the increasing melt volume was recognized as a dominate feature.

Several silicon manufactures transitioned to a horizontal magnetic field Czochralski process (HMCZ) in the early 2000's when high quality 300 mm silicon production started in order to control the crystal/melt interface effectively. Other silicon manufactures used a cusp magnetic field for 300 mm production of high quality silicon. In both cases, magnetic field in the silicon melt had a dramatic impact on crystal quality and performance and every manufacturer developed their own technique to optimize performance and quality from the onset.

During the process of producing single crystal silicon ingots with the CZ process and a magnetic field, oxygen may be introduced into silicon crystal ingots through a melt-solid or melt crystal interface. The oxygen may cause various defects in wafers produced from the ingots, reducing the yield of semiconductor devices fabricated using the ingots. For example, memory devices, insulated-gate bipolar transistors (IGBTs), high quality radio-frequency (RF), high resistivity silicon on insulator (HR-SOI), and charge trap layer SOI (CTL-SOI) applications typically require a low interstitial oxygen concentration (Oi) in order to achieve high resistivity. In the case of HMCZ process, it was believed that the process typically requires a very low crucible rotation (C/R) to control oxygen in the growing crystal, particularly to control oxygen inclusion to the desired range applicable for memory devices. Further, a higher occurrence ratio of lost zero dislocation (LZD) from the crown to the end of body was found in HMCZ as compared to processes using a cusp magnetic field.

Thus, there exists a need for methods and systems that reduce LZD losses with HMCZ growth and provide an improved ZD success ratio for high quality silicon growth from crown to body.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect of this disclosure, a method for producing a silicon ingot by the horizontal magnetic field Czochralski method includes rotating a crucible containing a silicon melt, applying a horizontal magnetic field to the crucible, contacting the silicon melt with a seed crystal, and withdrawing the seed crystal from the silicon melt while rotating the crucible to form a silicon ingot. The crucible has a wettable surface with a cristobalite layer formed thereon Another aspect is a wafer generated from a silicon ingot produced using the method described above.

Another aspect is a system for producing a silicon ingot. The system includes a crucible to contain a silicon melt, magnetic poles to produce a horizontal magnetic field, and a controller. The crucible has a wettable surface with a cristobalite layer formed thereon. The controller is programmed to produce a silicon ingot by rotating the crucible containing the silicon melt, applying a horizontal magnetic field to the crucible using the magnetic poles, contacting the silicon melt with a seed crystal, and withdrawing the seed crystal from the silicon melt while rotating the crucible to form a silicon ingot.

Various refinements exist of the features noted in relation to the above-mentioned aspect. Further features may also be incorporated in the above-mentioned aspect as well. These refinements and additional features may exist individually or in any combination. For instance, various features discussed below in relation to any of the illustrated embodiments may be incorporated into the above-described aspect, alone or in any combination.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Like reference symbols in the various drawings indicate like elements.

DETAILED DESCRIPTION

Figure 1:
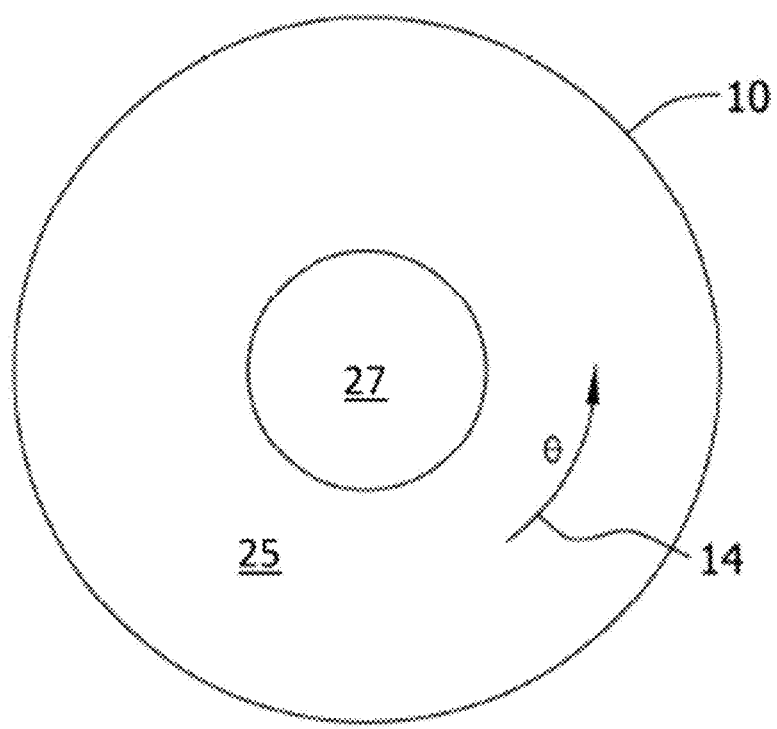
FIG. 1 is a top view of a crucible of one embodiment.
Figure 2:
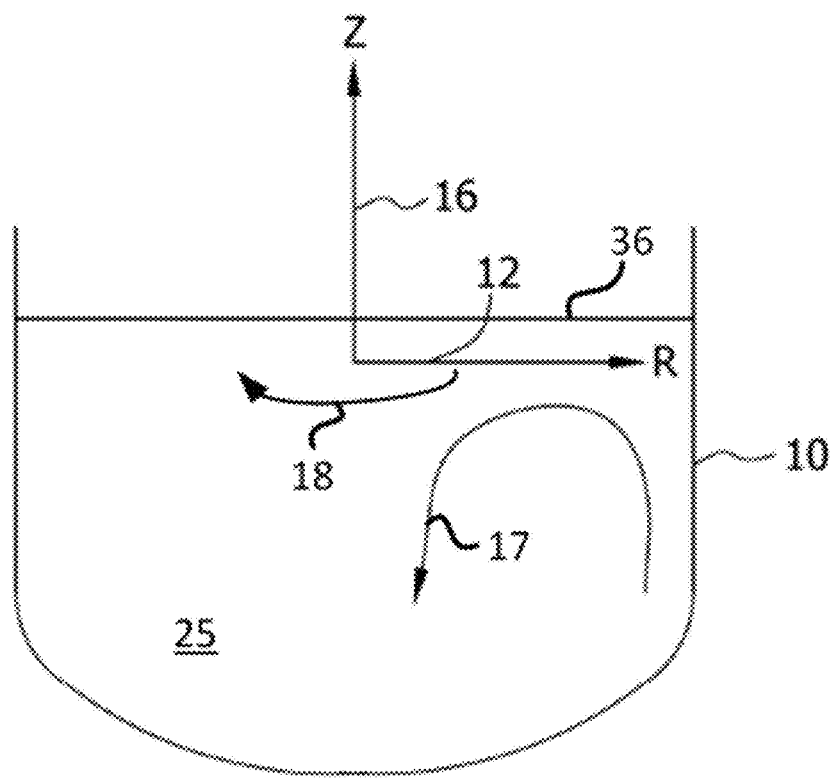
FIG. 2 is a side view of the crucible shown in FIG. 1.

Referring initially to FIGS. 1 and 2, a crucible of one embodiment is indicated generally at 10. A cylindrical coordinate system for crucible 10 includes a radial direction R 12, an angular direction θ 14, and an axial direction Z 16. The crucible 10 contains a melt 25 having a melt surface 36. A crystal 27 is grown from the melt 25. The melt 25 may contain one or more convective flow cells 17, 18 induced by heating of the crucible 10 and rotation of the crucible 10 and/or crystal 27 in the angular direction θ 14. The structure and interaction of these one or more convective flow cells 17, 18 are modulated via regulation of one of more process parameters and/or the application of a magnetic field as described in detail herein below.

Figure 3:
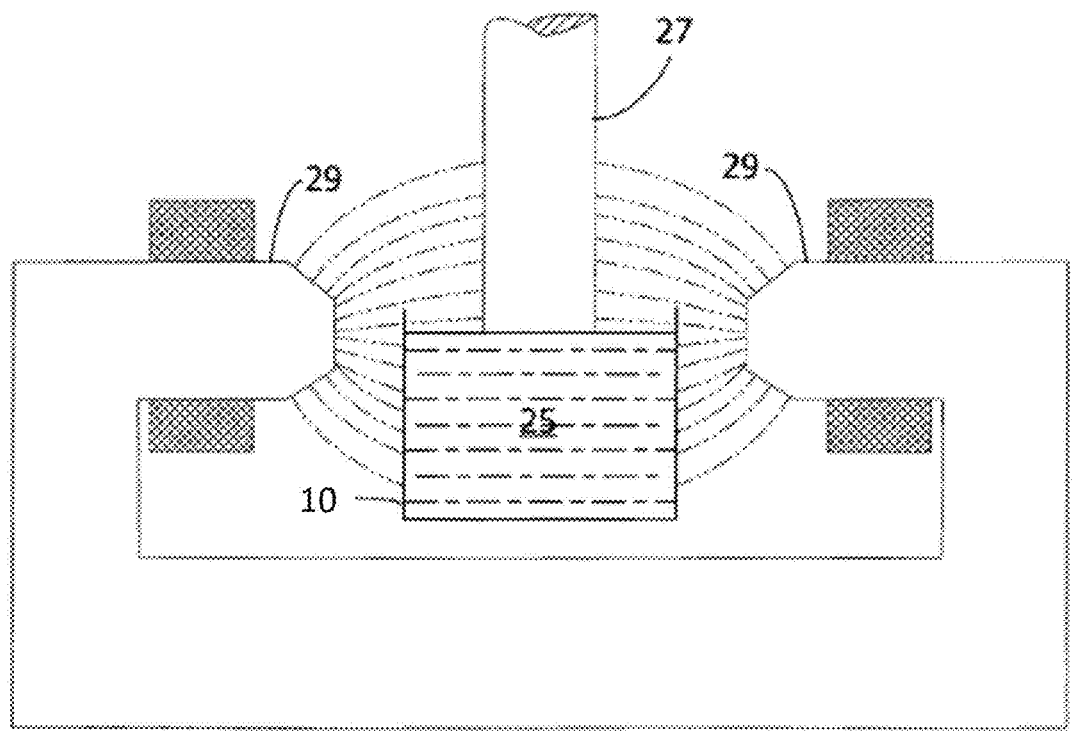
FIG. 3 is a schematic illustrating a horizontal magnetic field applied to a crucible containing a melt in a crystal growing apparatus.

FIG. 3 is a diagram illustrating a horizontal magnetic field being applied to crucible 10 containing melt 25 in a crystal growing apparatus. As shown, crucible 10 contains silicon melt 25 from which a crystal 27 is grown. The transition between the melt and the crystal is generally referred to as the crystal-melt interface (alternatively the melt-crystal, solid-melt or melt-solid interface) and is typically non-linear, for example concave, convex or gull-winged relative to the melt surface. Two magnetic poles 29 are placed in opposition to generate a magnetic field generally perpendicular to the crystal-growth direction and generally parallel to the melt surface 36. The magnetic poles 29 may be a conventional electromagnet, a superconductor electromagnet, or any other suitable magnet for producing a horizontal magnetic field of the desired strength. Application of a horizontal magnetic field gives rise to Lorentz force along axial direction, in a direction opposite of fluid motion, opposing forces driving melt convection. The convection in the melt is thus suppressed, and the axial temperature gradient in the crystal near the interface increases. The melt-crystal interface then moves upward to the crystal side to accommodate the increased axial temperature gradient in the crystal near the interface and the contribution from the melt convection in the crucible decreases. The horizontal configuration has the advantage of efficiency in damping a convective flow at the melt surface 36.

Figure 4:
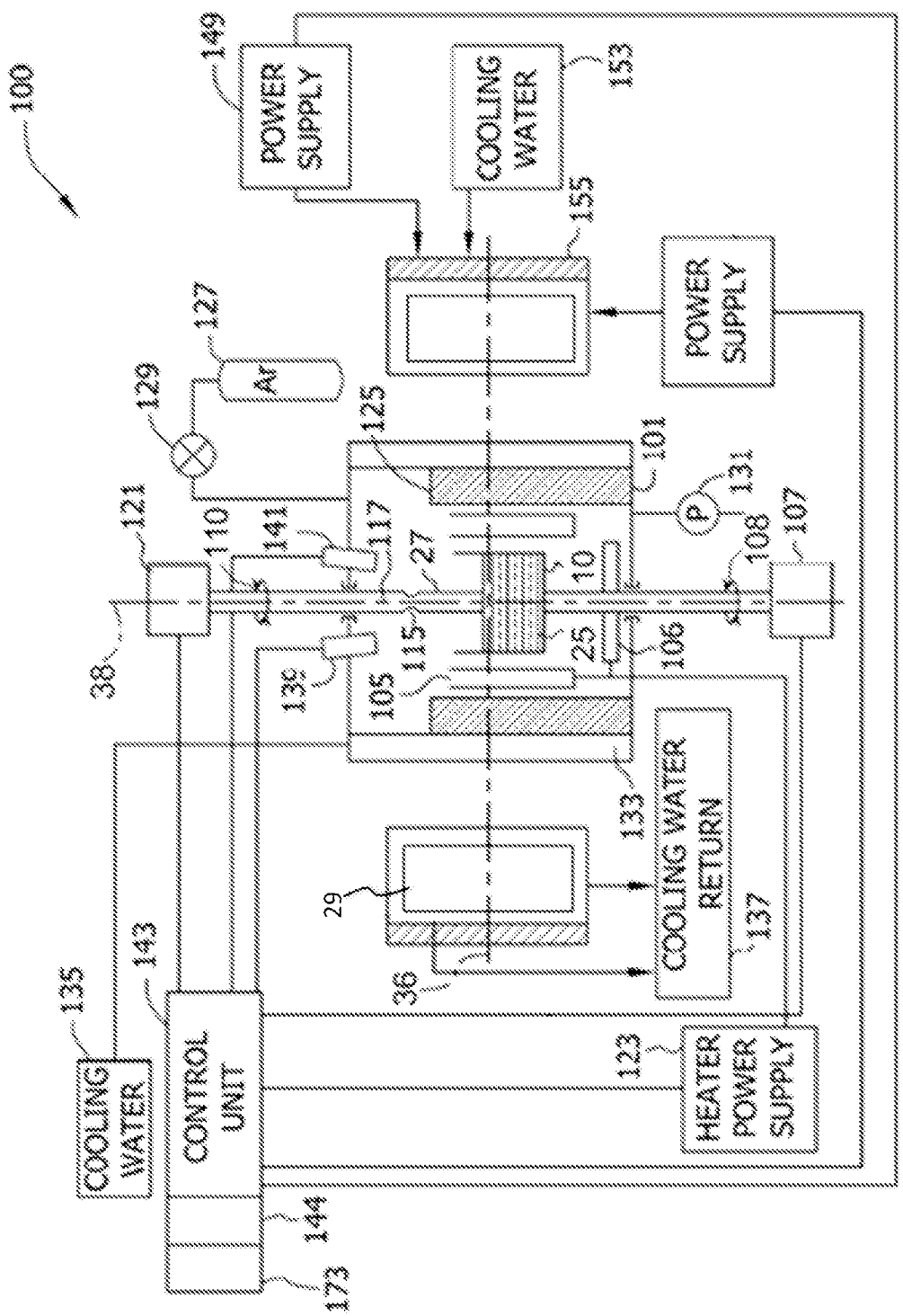
FIG. 4 is a block diagram of a crystal growing system.

FIG. 4 is a block diagram of a crystal growing system 100. System 100 employs a Czochralski crystal growth method to produce a semiconductor ingot. In this embodiment, system 100 is configured to produce a cylindrical semiconductor ingot having an ingot diameter of one-hundred and fifty millimeters (150 mm), greater than one-hundred fifty millimeters (150 mm), more specifically in a range from approximately 150 mm to 460 mm, and even more specifically, a diameter of approximately three-hundred millimeters (300 mm). In other embodiments, system 100 is configured to produce a semiconductor ingot having a two-hundred millimeter (200 mm) ingot diameter or a four-hundred and fifty millimeter (450 mm) ingot diameter. In addition, in one embodiment, system 100 is configured to produce a semiconductor ingot with a total ingot length of at least nine hundred millimeters (900 mm). In some embodiments, the system is configured to produce a semiconductor ingot with a length of one thousand nine hundred and fifty millimeters (1950 mm), two thousand two hundred and fifty millimeters (2250 mm), two thousand three hundred and fifty millimeters (2350 mm), or longer than 2350 mm. In other embodiments, system 100 is configured to produce a semiconductor ingot with a total ingot length ranging from approximately nine hundred millimeters (900 mm) to twelve hundred millimeters (1200 mm), between approximately 900 mm and approximately two thousand millimeters (2000 mm), or between approximately 900 mm and approximately two thousand five hundred millimeters (2500 mm). In some embodiments, the system is configured to produce a semiconductor ingot with a total ingot length greater than 2000 mm.

The crystal growing system 100 includes a vacuum chamber 101 enclosing crucible 10. A side heater 105, for example, a resistance heater, surrounds crucible 10. A bottom heater 106, for example, a resistance heater, is positioned below crucible 10. During heating and crystal pulling, a crucible drive unit 107 (e.g., a motor) rotates crucible 10, for example, in the clockwise direction as indicated by the arrow 108. Crucible drive unit 107 may also raise and/or lower crucible 10 as desired during the growth process. Within crucible 10 is silicon melt 25 having a melt level or melt surface 36. In operation, system 100 pulls a single crystal 27, starting with a seed crystal 115 attached to a pull shaft or cable 117, from melt 25. One end of pull shaft or cable 117 is connected by way of a pulley (not shown) to a drum (not shown), or any other suitable type of lifting mechanism, for example, a shaft, and the other end is connected to a chuck (not shown) that holds seed crystal 115 and crystal 27 grown from seed crystal 115.

Crucible 10 and single crystal 27 have a common axis of symmetry 38. Crucible drive unit 107 can raise crucible 10 along axis 38 as the melt 25 is depleted to maintain melt level 36 at a desired height. A crystal drive unit 121 similarly rotates pull shaft or cable 117 in a direction 110 opposite the direction in which crucible drive unit 107 rotates crucible 10 (e.g., counter-rotation). In embodiments using iso-rotation, crystal drive unit 121 may rotate pull shaft or cable 117 in the same direction in which crucible drive unit 107 rotates crucible 10 (e.g., in the clockwise direction). Iso-rotation may also be referred to as a co-rotation. In addition, crystal drive unit 121 raises and lowers crystal 27 relative to melt level 36 as desired during the growth process.

According to the Czochralski single crystal growth process, a quantity of polycrystalline silicon, or polysilicon, is charged to crucible 10. A heater power supply 123 energizes resistance heaters 105 and 106, and insulation 125 lines the inner wall of vacuum chamber 101. A gas supply 127 (e.g., a bottle) feeds argon gas to vacuum chamber 101 via a gas flow controller 129 as a vacuum pump 131 removes gas from vacuum chamber 101. An outer chamber 133, which is fed with cooling water from a reservoir 135, surrounds vacuum chamber 101.

The cooling water is then drained to a cooling water return manifold 137. Typically, a temperature sensor such as a photocell 139 (or pyrometer) measures the temperature of melt 25 at its surface, and a diameter transducer 141 measures a diameter of single crystal 27. In this embodiment, system 100 does not include an upper heater. The presence of an upper heater, or lack of an upper heater, alters cooling characteristics of crystal 27.

Magnetic poles 29 are positioned outside the vacuum chamber 101 to produce a horizontal magnetic field (shown in FIG. 3). Although illustrated approximately centered on the melt surface 36, the position of the magnetic poles 29 relative to the melt surface 36 may be varied to adjust the position of the maximum gauss plane (MGP) relative to the melt surface 36. A reservoir 153 provides cooling water to the magnetic poles 29 before draining via cooling water return manifold 137. A ferrous shield 155 surrounds magnetic poles 29 to reduce stray magnetic fields and to enhance the strength of the field produced.

A control unit 143 is used to regulate the plurality of process parameters including, but not limited to, at least one of crystal rotation rate, crucible rotation rate, and magnetic field strength. In various embodiments, the control unit 143 may include a memory 173 and processor 144 that processes the signals received from various sensors of the system 100 including, but not limited to, photocell 139 and diameter transducer 141, as well as to control one or more devices of system 100 including, but not limited to: crucible drive unit 107, crystal drive unit 121, heater power supply 123, vacuum pump 131, gas flow controller 129 (e.g., an argon flow controller), magnetic poles power supply 149, and any combination thereof. The memory 173 may store instructions that, when executed by the processor 144 cause the processor to perform one or more of the methods described herein. That is, the instructions configure the control unit 143 to perform one or more methods, processes, procedures, and the like described herein.

Control unit 143 may be a computer system. Computer systems, as described herein, refer to any known computing device and computer system. As described herein, all such computer systems include a processor and a memory. However, any processor in a computer system referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel. Further, the computer system may located near the system 100 (e.g., in the same room, or in an adjacent room), or may be remotely located and coupled to the rest of the system via a network, such as an Ethernet, the Internet, or the like.

The term processor, as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor." The memory may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM).

In one embodiment, a computer program is provided to enable control unit 143, and this program is embodied on a computer readable medium. The computer readable medium may include the memory 173 of the control unit 143. In an example embodiment, the computer system is executed on a single computer system. Alternatively, the computer system may comprise multiple computer systems, connection to a server computer, a cloud computing environment, or the like. In some embodiments, the computer system includes multiple components distributed among a plurality of computing devices. One or more components may be in the form of computer-executable instructions embodied in a computer-readable medium.

The computer systems and processes are not limited to the specific embodiments described herein. In addition, components of each computer system and each process can be practiced independent and separate from other components and processes described herein. Each component and process also can be used in combination with other assembly packages and processes.

In one embodiment, the computer system may be configured to receive measurements from one or more sensors including, but not limited to: temperature sensor 139, diameter transducer 141, and any combination thereof, as well as to control one or more devices of system 100 including, but not limited to: crucible drive unit 107, crystal drive unit 121, heater power supply 123, vacuum pump 131, gas flow controller 129 (e.g., an argon flow controller), magnetic poles power supply 149, and any combination thereof as described herein and illustrated in FIG. 4 in one embodiment. The computer system performs all of the steps used to control one or more devices of system 100 as described herein.

The loss of zero dislocation (ZD) structure (quantified by LZD rate) is generally higher during silicon crystal Cz growth in a horizontal magnet (HMCZ) field versus growth in a Cusp (or vertical) magnetic field. However, the LZD rate in HMCZ can be lowered dramatically if the crystal is grown in a synthetic lined crucible versus a natural sand lined crucible. But while the ZD rate is better, the cost of synthetic lined crucibles is higher than natural sand. Additionally, the thin (roughly 2 mm thickness) synthetic liner dissolves in a relatively short process time, leaving the backing sand layer exposed to the melt, which allows quartz particles to enter the melt and hit the growing crystal. Thus, the exposure of bubbles in the liner or even from the backing sand into the melt is higher. To avoid bubble exposure and/or backing sand contamination by dissolution when using synthetic lined crucibles, the process hot hours are generally limited to less than ~250 hours, which is much shorter process time than achievable for natural sand crucibles (approximately 400-500 hours or more). Because the hot time for crystal growth depends on the process conditions, HZ configuration, and attempts, recharge capability and multiple rod growth per batch can be impacted using synthetic lined crucibles. Therefore, silicon growth using HMCZ in synthetic lined crucibles generally requires optimization of the crucible condition to ensure the best ZD rate and lowest attempts so that maximum recharge capability can be achieved.

Figure 5:
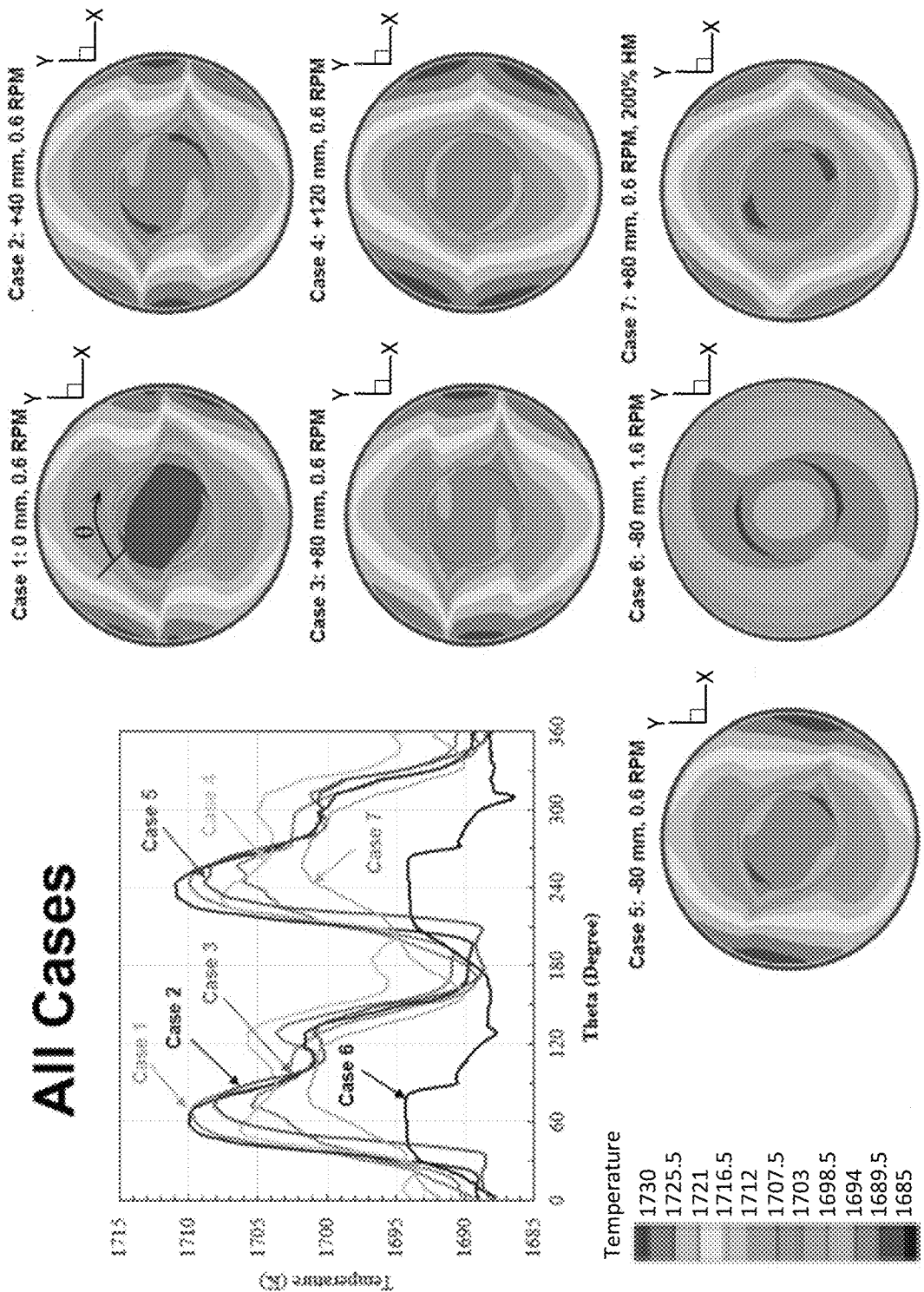
FIG. 5 presents temperature field in melt free surface by MGP in mm and crucible rotation in RPM.

Further, a horizontal magnet in Cz growth enhances the melt flow with an irregular velocity melt wave continuously knocking against the crucible wall surface with a strong force in a transient behavior. In this case, the crucible surface condition is very critical for quartz piece generation which directly relates to the ZD success. This is illustrated in FIG. 5, in which the melt flow and temperature field of the melt are significantly impacted by the magnetic field strength and MGP position. As shown in the figure, the temperature variation of the circumferential direction at the melt surface is markedly changed by the magnetic field direction.

These and other difficulties may be overcome or mitigated in embodiments of the present disclosure through use of one or both of two techniques described in detail below. Generally, in the first aspect, a cristobalite layer is formed on the wettable surface of the interior of the crucible. The wettable surface generally refers to the surface of the crucible that may be in contact with the melt during silicon production. The wettable surface generally includes the interior bottom of the crucible, at least a portion of the interior sidewalls of the crucible, and the interior portions connecting the interior sidewalls and bottom of the crucible. In FIG. 2, the wettable surface is all of the interior surface of the crucible 10 below and including the melt surface 36. The wettable surface may also extend above the melt surface 36. The second technique described in this disclosure is to increase the rotational speed of the crucible.

In general, a strong and unsteady melt flow is induced by an HMCZ magnetic field and this can generate strong thermo-mechanical stress and mechanical impact on the crucible wall causing quartz particle generation. However, high crucible rotation (C/R) will produce faster convective flow near the crucible wall surface, which can interfere with the melt flow driven by a magnetic field. This will reduce the stress and impact on the wall surface. Consequently, the generation of quartz particles at the wall surface is reduced which in turn reduces LZDs during crystal growth.

LZDs may also be reduced by enabling the formation of a generally uniform crystalline SiO2 layer (referred to as cristobalite layer) on the crucible's wettable surface. This layer is more stable and stronger than amorphous quartz itself, and thereby it is more resistant to melt attack by stress or mechanical impact. Thus, the cristobalite layer reduces quartz particle generation.

There are at least two methods to promote crystalline layer growth on quartz crucibles. The first method is to use pre-coated crucibles precoated with a compound, such as BaOH, that will promote cristobalite growth, and the other is to add a suitable melt modifier (MM) into the melt before crystal growth. Nonlimiting examples of suitable MMs include barium (Ba) and strontium (Sr). More specifically, nonlimiting example of suitable MMs include barium carbonate (BaCO3), barium oxide (BaO), and strontium carbonate (SrCO3).

Figure 6:
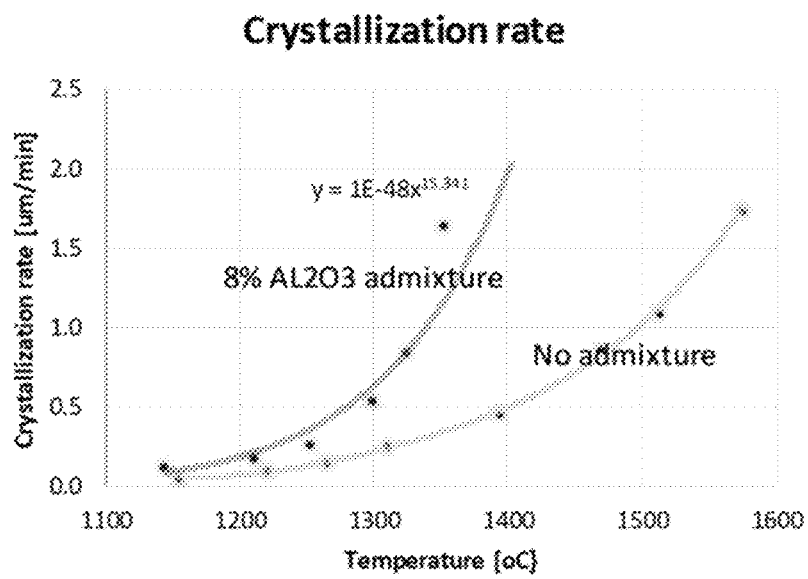
FIG. 6 is a graph of crystallization rate as a function of time.
Figure 7:
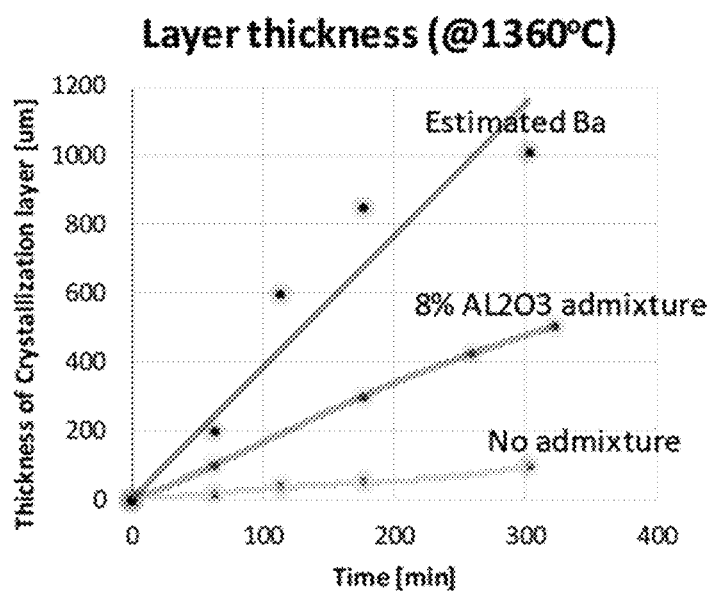
FIG. 7 is a graph of the thickness of the layer formed as a function of time at a temperature of 1360° C.

Cristobalite formation on the amorphous quartz inner wall is governed by pressure, Oi concentration, H2O and hydrogen content, temperature, and the like. As shown in FIGS. 6 and 7, the formation and growth of a crystalline layer on the crucible wall is governed by the temperature of the crucible wall and concentration of the MM, which is consumed by the crucible. FIG. 6 compares the crystallization rate as a function of time for no MM and an 8% AL2O3 MM. FIG. 7 compares the thickness of the layer formed as a function of time at a temperature of 1360° C. for no MM, an 8% AL2O3 MM, and a barium based MM. These charts indicates that a proper MM addition (e.g., a barium based MM) into the melt or a pre-coating of a barium compound generates a uniform and thick crystalline (i.e., cristobalite) layer on the wall of natural sand crucibles giving similar behavior and performance to synthetic lined crucibles. Because the cristobalite layer has slower dissolution rate than the fused quartz, the generation of quartz pieces by thermo or mechanical stress is decreased so the crystal LZD occurrence is decreased thereafter. Further, the generation of secondary bubbles in the Bubble Free Layer (BFL) of the natural sand crucible and its propagation into the melt is much less than that of synthetic lined crucible in general due to the difference of material properties.

The formation and growth of a uniform cristobalite layer either through pre-coating on the crucible or post addition of melt modifier into the melt is started during stabilization mode prior to crystal growth (i.e. after melting of poly silicon or during the melting). In case of a post MM addition, the MM is introduced after meltdown, so the formation speed of the cristobalite is slower than otherwise pre-coated case. However, post addition of the MM can yield lower air pocket (APK) losses because bubbles formed and trapped at the crucible wall can be released to the surface prior to the formation of the stable cristobalite layer. Because it typically takes 3~7 hours from the start of the stabilization step to the start of body growth, the cristobalite thickness is estimated to be greater than about 2 mm with an appropriate amount of MM added to increase the formation rate of the cristobalite. In practice, a cristobalite layer of less than about 1.0 mm is typically formed on the surface of the crucible (whether natural sand or synthetic). Some special case, such as heavily doped process for P++ or N++, yield a thicker cristobalite layer by adding a large amount of MM. In such cases a cristobalite layer of approximately 1.0 mm (+/−) is formed. These thicknesses differ from the 2.0 mm because although the cristobalite layer is grown by hot time as shown in FIG. 7, wet cristobalite layer is continuously being dissolved to melt. Other embodiments include a cristobalite layer of approximately 2.0 mm, greater than 1.5 mm, greater than 1.0 mm, greater than 0.75 mm, greater than 0.5 mm, or greater than 0.25 mm formed on the wettable surface of the crucible. In some embodiments the cristobalite layer is less than 3.0 mm thick, less than 2.0 mm thick, less than 1.25 mm thick, or less than 1.0 mm thick. In some embodiments, the cristobalite layer falls within a range defined by the minima and maxima above, such as between 0.25 mm and 1.25 mm. Generally, too thin a cristobalite layer may be insufficient to provide the benefits described herein, while too thick a cristobalite layer may be more likely to break and enter the melt (potentially contributing to an LZD) during silicon production.

Melt modifier addition described above forms a uniform crystalline layer at the crucible wettable surface and this crystalline structure has a strong resistance against the thermomechanical stress induced by the irregular (transient) melt flow produced during HMCZ. The formation of a thick and uniform cristobalite can resist the stress and impact from the melt flow, reducing crucible surface damage (i.e., resisting damage generating quartz particles in the melt) which will increase the ZD success.

As mentioned previously, a strong convective flow caused by higher crucible rotation will reduce the variation of temperature in the melt free surface and reduce the melt flow induced by a horizontal magnet as seen in Case 6 in FIG. 5. In case 6, C/R is 1.6 RPM as compared to 0.6 RPM in cases 1-5 and 7. In other words, the force produced by the magnetic field from the melt to the crucible wall surface is reduced or blocked by the convective flow related with higher crucible rotation. Thereby, the possibility of quartz piece generation due to damage of crucible wall surface is decreased, also improving the potential of ZD success.

Figure 8:
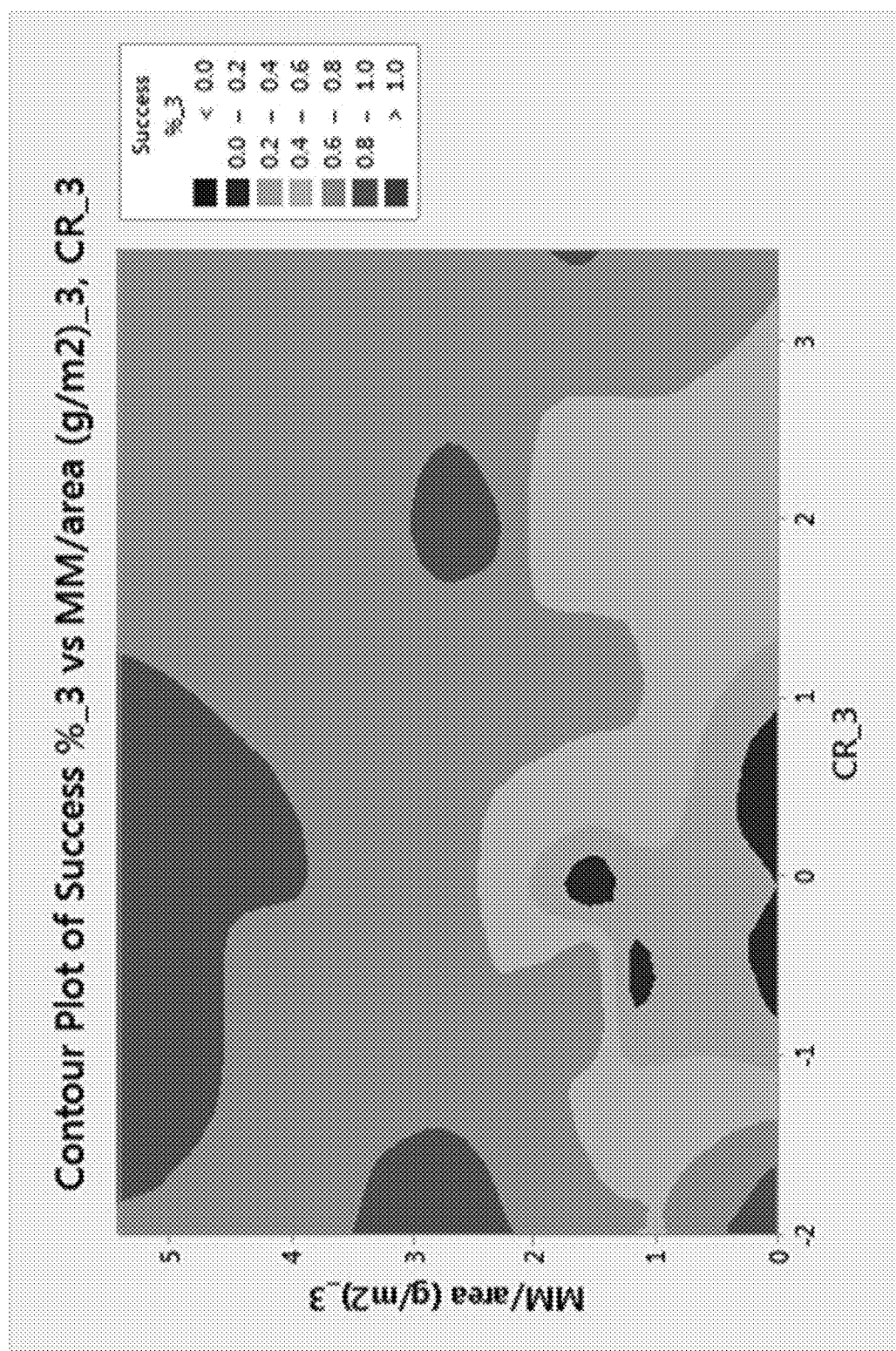
FIG. 8 is a contour plot of ZD success ratio by crucible rotation and the quantity of melt modifier in a natural sand crucible.

A test condition was performed to understand ZD success and on both synthetic lined and natural sand crucibles in a horizontal magnet as a function of crucible rotation speed and the quantity of melt modifier addition. The synthetic crucible showed high ZD success ratio across a broad range of crucible rotation and MM. For the natural sand lined crucible, a total of 96 trials with 19 different conditions were completed and the results are summarized with a contour plot in FIG. 8. The data for FIG. 8 was from approximately 200 mm body length to approximately OE of the crystal. In FIG. 8, CR is the crucible rotation in RPM, a Success %_3 of 0.0 is a ZD fail (LZD), and a Success % 3 of 1.0 is 100% ZD success. The sign of the crucible rotation indicates direction of rotation of the crucible. For some pulls, the crucible rotation ramped between speeds during portions of the pull, an arbitrary value of crucible rotation was selected for plotting, and the data was collected from greater than 1000 mm body length to approximately OE of the crystal. Results clearly show that higher ZD success ratio is achieved with increasing the absolute value of the speed of crucible rotation and quantity of melt modifier (in this case, Ba based).

The use of increased speed of crucible rotation and the creation of a cristobalite layer are shown to individually and in combination result in improved ZD outcomes. At lower C/R, such as between about 0 and about 2 RPM, addition of suitable MM (or use of precoated crucible) is needed to increase the ZD success ratio. As the C/R is increased to between about 2 RPM and about 5 RPM, the amount of MM needed to gain an equivalent success rate decreases and may even be zero MM. Within this range, additional gains in ZD success ratio may be obtained through use of at least some MM. When the C/R exceeds about 5 RPM there is generally no ZD concern from the crucible and no MM is likely to be needed. However, at such speeds, additional process condition will likely be required to control the quality of the products, because it may have other issues such as oxygen control due to melt flow velocity, melt level control caused by centrifugal force, and the like.

Thus, some embodiments of the present disclosure use a MM more than 1.7 grams per square meter of the wettable surface area of crucible during an HMCZ process at any C/R rate to improve the ZD success rate. In some embodiments, a MM between 1.7 and 2.0 grams/m$^2$ of the wettable surface of the crucible is used. In still other embodiments, a MM between 1.7 and 5.4 grams/m$^2$ of the wettable surface of the crucible is used. In still other embodiments, a MM greater than 5.4 grams/m$^2$ of the wettable surface of the crucible may be used, but the large amount of MM might cause LZD in multiple recharge processes. The quantities above (e.g., 1.7 grams/m$^2$) are based on BaCO3 as the MM. Similar embodiments using BaO or SrCO3 include an amount of the particular MM functionally equivalent to the amount of BaCO3.

Some embodiments use a MM between about 0 and 0.5 g/m$^2$ and a crucible rotation greater than about 2.0 RPM. In some such embodiments, the crucible is a natural sand crucible. Alternatively, the crucible may be a synthetic crucible.

Embodiments of the methods described herein achieve superior results compared to prior methods and systems. For example, the methods described herein facilitate producing silicon with a higher ZD success rate than some other methods.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," is not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As various changes could be made in the above without departing from the scope of the invention, it is intended that all matter contained in the above description and shown in the accompanying drawings shall be interpreted as illustrative and not in a limiting sense.

What is claimed is:

1. A method for producing a silicon ingot, the method comprising:
    rotating a natural sand crucible containing a silicon melt, the crucible having an inner wall with a cristobalite layer formed thereon at more than two revolutions per minute, the cristobalite layer having a thickness of more than between 0.25 mm and 1.25 mm;
    applying a horizontal magnetic field to the crucible;
    contacting the silicon melt with a seed crystal; and
    withdrawing the seed crystal from the silicon melt while rotating the crucible between two revolutions per minute and five revolutions per minute to form the silicon ingot.

2. The method of claim 1, wherein the method further comprises:
    adding solid-phase polycrystalline silicon to the natural sand crucible; and
    heating the polycrystalline silicon to form the silicon melt.

3. The method of claim 2, further comprising adding a melt modifier to the natural sand crucible to form the cristobalite layer on the inner wall of the natural sand crucible.

4. The method of claim 3, wherein adding the melt modifier comprises adding the melt modifier while heating the polycrystalline silicon to form the silicon melt.

5. The method of claim 3, wherein adding the melt modifier comprises adding the melt modifier after the silicon melt has been formed.

6. The method of claim 3, wherein adding the melt modifier comprises adding barium carbonate (BaCO$_3$).

7. The method of claim 6, wherein adding barium carbonate comprises adding more than 1.7 grams per square meter of the inner wall of the natural sand crucible.

8. The method of claim 3, wherein adding the melt modifier comprises adding one of barium oxide (BaO) or strontium carbonate (SrCO$_3$).

9. The method of claim 2, wherein adding solid-phase polycrystalline silicon to the natural sand crucible comprises adding solid-phase polycrystalline silicon to the natural sand crucible having a barium based coating already formed on the inner wall of the natural sand crucible.

10. A wafer from a silicon ingot produced according to the method of claim 1.

* * * * *

UNITED STATES PATENT AND TRADEMARK OFFICE
CERTIFICATE OF CORRECTION

PATENT NO. : 11,873,574 B2
APPLICATION NO. : 17/115154
DATED : January 16, 2024
INVENTOR(S) : JaeWoo Ryu et al.

Page 1 of 1

It is certified that error appears in the above-identified patent and that said Letters Patent is hereby corrected as shown below:

In the Claims

In Claim 1, Column 10, Line 20, delete "more than between 0.25 mm and 1.25 mm" and insert therefor -- between 0.25 mm and 1.25 mm --.

Signed and Sealed this
Twenty-sixth Day of November, 2024

Katherine Kelly Vidal
*Director of the United States Patent and Trademark Office*